United States Patent
Khurana

(10) Patent No.: US 7,079,908 B2
(45) Date of Patent: Jul. 18, 2006

(54) HORIZONTALLY-STRUCTURED MODELING FOR ANALYSIS

(75) Inventor: Pravin Khurana, Rochester, MI (US)

(73) Assignee: Delphi Technologies, Inc., Troy, MI (US)

( * ) Notice: Subject to any disclaimer, the term of this patent is extended or adjusted under 35 U.S.C. 154(b) by 121 days.

(21) Appl. No.: 10/355,326

(22) Filed: Jan. 31, 2003

(65) Prior Publication Data

US 2004/0153186 A1 Aug. 5, 2004

(51) Int. Cl.
*G06F 19/00* (2006.01)

(52) U.S. Cl. .................... 700/98; 700/97; 700/182; 703/1

(58) Field of Classification Search .......... 700/96, 700/98, 182, 90, 118; 703/1, 2, 6; 345/762, 345/420
See application file for complete search history.

(56) References Cited

U.S. PATENT DOCUMENTS

| | | | |
|---|---|---|---|
| 5,184,426 A | 2/1993 | Minatani | 51/165.71 |
| 5,351,196 A | 9/1994 | Sowar et al. | 364/474.24 |
| 5,434,791 A | 7/1995 | Koko et al. | 364/468 |
| 5,467,293 A | 11/1995 | Summer et al. | 364/578 |
| 5,659,493 A | 8/1997 | Kiridena et al. | 364/578 |
| 5,691,909 A | 11/1997 | Frey et al. | 364/474.01 |
| 5,710,709 A | 1/1998 | Oliver et al. | 364/474.26 |
| 5,768,136 A | 6/1998 | Fujiwara et al. | 364/474.24 |
| 5,793,647 A | 8/1998 | Hageniers et al. | 364/507 |
| 5,808,432 A | 9/1998 | Inoue et al. | 318/561 |
| 5,815,154 A | 9/1998 | Hirschtick et al. | 345/356 |
| 6,073,056 A | 6/2000 | Gawronski et al. | 700/98 |
| 6,120,171 A | 9/2000 | Shaikh | 364/468.04 |
| 6,219,049 B1 | 4/2001 | Zuffante et al. | 345/339 |
| 6,219,055 B1 | 4/2001 | Bhargava et al. | 345/355 |
| 6,263,252 B1 * | 7/2001 | St. Ville | 700/98 |
| 6,323,863 B1 | 11/2001 | Shinagawa et al. | 345/441 |
| 6,341,153 B1 | 1/2002 | Rivera et al. | 378/4 |
| 6,341,996 B1 | 1/2002 | Brien et al. | 451/8 |
| 6,356,800 B1 | 3/2002 | Monz et al. | 700/184 |
| 6,430,455 B1 | 8/2002 | Rebello et al. | 700/105 |
| 6,599,125 B1 | 7/2003 | Freilich et al. | 433/212.1 |
| 6,629,065 B1 * | 9/2003 | Gadh et al. | 703/1 |
| 6,947,879 B1 * | 9/2005 | Yamada et al. | 703/2 |
| 2002/0133252 A1 | 9/2002 | Landers et al. | 700/97 |
| 2002/0133253 A1 | 9/2002 | Landers et al. | 700/98 |
| 2002/0133264 A1 | 9/2002 | Maiteh et al. | 700/182 |
| 2002/0133265 A1 | 9/2002 | Landers et al. | 700/182 |
| 2002/0133266 A1 | 9/2002 | Landers et al. | 700/182 |
| 2002/0133267 A1 | 9/2002 | Landers et al. | 700/182 |
| 2002/0133803 A1 | 9/2002 | Landers et al. | 717/104 |
| 2002/0152000 A1 | 10/2002 | Landers et al. | 700/98 |
| 2003/0004596 A1 | 1/2003 | Landers et al. | 700/98 |

(Continued)

OTHER PUBLICATIONS

U.S. Appl. No. 10/355,310, filed Jan. 31, 2003, Landers et al.

(Continued)

*Primary Examiner*—Leo Picard
*Assistant Examiner*—Alexander J. Kosowski
(74) *Attorney, Agent, or Firm*—Michael D. Smith

(57) ABSTRACT

A method of horizontally structured CAD/CAM/CAE modeling for analysis comprising: establishing a horizontally structured model of an object in a CAD/CAM/CAE modeling system; creating an analysis model from the horizontally structured model; and performing analysis employing the analysis model. A horizontally structured analysis model formulated with a CAD/CAM/CAE modeling system comprising: a horizontally structured model of an object; an analysis model created from the horizontally structured model, wherein the analysis model is employed for performing analysis.

22 Claims, 6 Drawing Sheets

Create Model using Horizontally Structured approach.

Create Analyis Model(s) containing relevant features. (Top Boss Feature not required for this analysis scenario)

Develop Finite Element Analysis (FEA) mesh using Analysis Model

U.S. PATENT DOCUMENTS

| | | | |
|---|---|---|---|
| 2003/0033041 A1 | 2/2003 | Richey | 700/98 |
| 2003/0080957 A1* | 5/2003 | Stewart et al. | 345/420 |
| 2003/0114945 A1 | 6/2003 | Hirano et al. | 700/97 |
| 2004/0122630 A1* | 6/2004 | Fife | 703/2 |

OTHER PUBLICATIONS

U.S. Appl. No. 10/355,355, filed Jan. 31, 2003, Landers et al.
U.S. Appl. No. 10/355,662, filed Jan. 31, 2003, Landers et al.
U.S. Appl. No. 10/355,749, filed Jan. 31, 2003, Landers et al.
U.S. Appl. No. 10/355,763, filed Jan. 31, 2003, Landers et al.
U.S. Appl. No. 10/358,870, filed Feb. 5, 2003, Thomas et al.
U.S. Appl. No. 10/358,874, filed Feb. 5, 2003, Thomas et al.
U.S. Appl. No. 10/359,001, filed Feb. 5, 2003, Thomas et al.
William H. Beyer, Ph.D., editor; CRC Handbook of Mathematical Sciences, 5th Edition, 1978, pp. 354-355.
Sridhar S. Condoor, "Integrating Design in Engineering Graphics Courses Using Feature-Based, Parametric Solid Modeling," ASEE/IEEE Frontiers in Education Conference 12d2-13; 1999; pp. 12d2-13-12d2-17.
Chih-Hsing Chu and Chun-Fong You; "Operation Planning in NC Programming Based on CAD Systems," found at http://dnclab.berkeley.edu/lma/people/chchu/paper/NCoptim.html.
Solid Edge User's Guide Version 12 2001.
What's New in Unigraphics V18.0.5.2 User Guide 2002.
Hemmett, Fussell, Jerard: "A Robust and Efficient Approach to Feedrate Selection for 3-axis Machining" ASME International Mechanical Engineering Congress and Exposition, Nov. 2000.
Roth D et al: "Surface swept by a toroidal cutter during 5-axis machining" Computer Aided Design, Elsevier Publishers BV., Barking, GB, vol. 33, No. 1, Jan. 2001, pp. 57-63.
Spence A D et al: "Integrated solid modeller based solutions for machining" Computer Aided Design, Elsevier Publishers BV., Barking, GB, vol. 32, No. 8-9, Aug. 2000, pp. 553-568.
Wang W P et al: "Geometric Modeling for Swept Volume of Moving Solids" IEEE Computer Graphics and Applications, IEEE Inc. New York, US, vol. 6, No. 12, Dec. 1, 1986, pp. 8-17.
Solid Edge User's Guide Version 6, MU28900-ENG. by Unigraphics Solutions, 1998, pp. 28, 29, 33, 90, 91, 96, 157 and 178.
Artificial Intelligence (Understanding Computers series), Time-Life Books, 1986, ISBN-0-8094-5675-3, pp. 36-43.

* cited by examiner

Create Analyis Model(s) containing relevant features. (Top Boss Feature not required for this analysis scenario)

110

Develop Finite Element Analysis (FEA) mesh using Analysis Model

100

Create Model using Horizontally Structured approach.

US 7,079,908 B2

HORIZONTALLY-STRUCTURED MODELING FOR ANALYSIS

BACKGROUND

This invention relates to Computer-Aided Design, Computer-Aided Manufacturing, and Computer-Aided Engineering (CAD/CAM/CAE) methods. CAD/CAM/CAE software systems are long known in the computer art. Some utilize wire-and-frame methods of building models while others utilize form features. Typically, in the form feature method of building CAD/CAM/CAE models, physical features are added to the model in an associative relationship with whatever other feature they are immediately attached to. Unfortunately, then, the alteration or deletion of any one feature will result in the alteration or deletion of any other features attached to it. This makes altering or correcting complicated models extensive and time-consuming.

BRIEF SUMMARY

Disclosed herein is method of horizontally structured CAD/CAM/CAE modeling for analysis comprising: establishing a horizontally structured model of an object in a CAD/CAM/CAE modeling system; creating an analysis model from the horizontally structured model; and performing analysis employing the analysis model.

Also disclosed herein is a horizontally structured analysis model formulated with a CAD/CAM/CAE modeling system comprising: a horizontally structured model of an object; an analysis model created from the horizontally structured model, wherein the analysis model is employed for performing analysis.

Also disclosed herein is a horizontally structured analysis model formulated with a CAD/CAM/CAE modeling system comprising: a means for establishing a horizontally structured model of an object in a CAD/CAM/CAE modeling system; a means for creating an analysis model from said horizontally structured model; and a means for performing analysis employing said analysis model.

Further disclosed is a storage medium encoded with a machine-readable computer program code for horizontally structured CAD/CAM/CAE modeling for analysis. The storage medium including instructions for causing a computer to implement the above-mentioned method.

Additionally disclosed is a computer data signal for horizontally structured CAD/CAM/CAE modeling for analysis. The computer data signal comprising code configured to cause a processor to implement the above-mentioned method.

DETAILED DESCRIPTION OF AN EXEMPLARY EMBODIMENT

Figure 1:
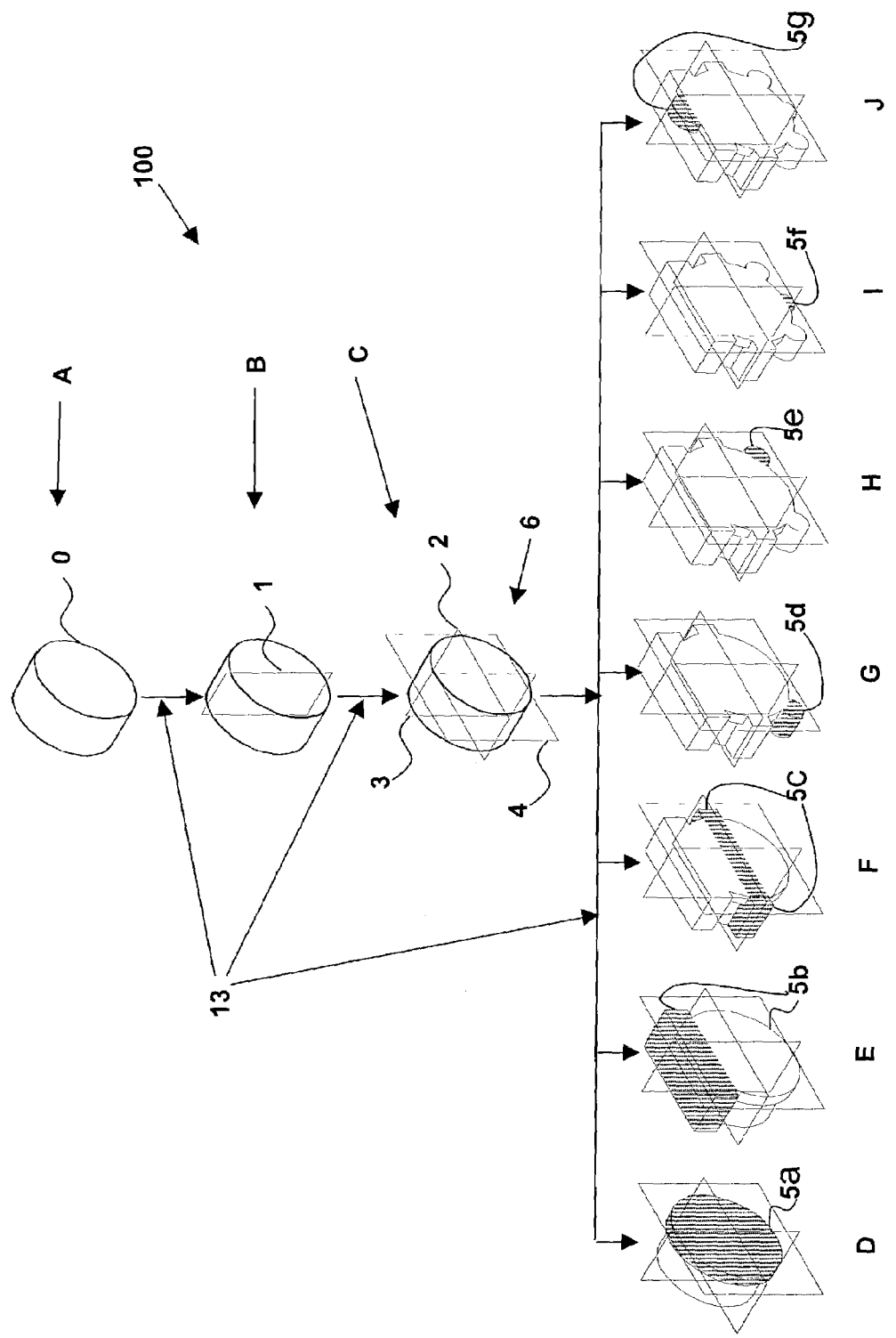
FIG. 1 is a schematic of the horizontal modeling method.

Disclosed herein is a method of computer-aided design modeling that employs the superior benefits of horizontally structured modeling over the modeling employing vertical methods for the purposes of analysis. The disclosed embodiments permit development of a model directed to analysis and yet readily permit alterations, additions, and deletions of individual features (e.g., holes, bosses, and the like) of a virtual part, wherein a change in any one feature is independent of the remaining features. The disclosed method may be implemented on any CAD/CAM/CAE software package that supports (a) reference planes or their Cartesian equivalents, (b) parametric modeling or its equivalent, and (c) feature modeling or its equivalents.

A "horizontal tree structure" is employed to add features to a model, preferably by establishing an exclusive parent/child relationship between a set of reference planes and each feature. The reference planes themselves may, but need not be, children of a parent base feature from which a horizontally structured model is developed. Moreover, the reference planes themselves may, but need not be, children of a parent virtual blank model that may correspond to a real-world part or blank in the manufacturing process model. The parent/child relationship means that changes to the parent will affect the child, but changes to the child have no effect upon the parent. Since each added feature of the model is related exclusively to a reference coordinate, then individual features may be added, edited, suppressed or deleted individually without affecting the rest of the model.

Throughout this specification, examples and terminology will refer to Unigraphics® software for illustrative purposes, but the method is not to be construed as limited to that particular software package. Other suitable CAD/CAM/CAE software packages that meet the three criteria above and that would therefore be suitable. For example, other suitable software packages include, but may not be limited to, SOLID EDGE®, also by Unigraphics®, and CATIA® by IBM®. Note that the phrases "datum planes", "parametric modeling" and "features" are phrases derived from the Unigraphics® documentation and may not necessarily be used in other software packages. Therefore, their functional definitions are set out below.

"Model" refers to the part that is being created via the CAD/CAM/CAE software. The model comprises a plurality of modeling elements including "features".

"Datum planes" refer to reference features that define Cartesian coordinates by which other features may be referenced to in space. In Unigraphics®, the datum planes are two-dimensional, but a plurality of datum planes may be added to a drawing to establish three-dimensional coordinates. These coordinates may be constructed relative to the model to move and rotate with the model. Regardless of how the coordinate system is created, for the purposes of this disclosure it should be possible to reference numerous features to the same coordinate system.

"Parametric modeling capabilities" refers to the ability to place mathematical constraints or parameters on features of the model so that the features may be edited and changed later. Models that do not have this capability i.e., models that include non-editable features, are referred to as "dumb solids". Most CAD/CAM/CAE systems support parametric modeling.

"Features" refers to parts and details that combine to form the model. A "reference feature", such as a coordinate system, is an imaginary feature that is treated and manipulated like a physical feature, but does not appear in the final physical model.

"Feature modeling" is the ability to build up a model by adding and connecting a plurality of editable features. Not all CAD/CAM/CAE software supports this capability. AutoCAD®, for example, currently employs a wire-frame-and-skin methodology to build models rather than feature modeling. An aspect of feature modeling is the creation of associative relationships among models, model elements, features, and the like, as well as combinations of the foregoing, meaning the features are linked such that changes to one feature may alter the others with which it is associated. An exemplary associative relationship is a "parent/child relationship".

"Parent/child relationship" is a type of associative relationship among models, model elements, features, and the like, as well as combinations of the foregoing. For example, a parent/child relationship between a first feature (parent) and a second feature (child) means that changes to the parent feature will affect the child feature (and any children of the child all the way down the familial line), but changes to the child will have no effect on the parent. Further, deletion of the parent results in deletion of all the children and progeny below it. The foregoing definition is intended to address associative relationships created as part of generating a model, notwithstanding associative relationships created because of the application of expression driven constraints applied to feature parameters.

The present invention relates to the design and analysis of an object based upon a virtual CAD/CAM/CAE model. An inventive aspect of this method is that the model is horizontally structured as disclosed in U.S. Publication No. US2002-0133803A1, U.S. patent application Ser. No. 10/032,960, Filed Oct. 24, 2001, entitled "ENHANCEMENT TO HORIZONTALLY-STRUCTURED CAD/CAM MODELING", the disclosures of which are incorporated by reference herein in their entirety.

Additional inventive aspects of the processes disclosed herein are related to the disclosure in copending, U.S. Publication No. 2004-0153296 U.S. patent application Ser. No. 10/355,749 Filed concurrently herewith on Jan. 31, 2003 entitled "Horizontally Structured CAD/CAM Coordinate System," the disclosures of which are incorporated by reference herein in their entirety.

Horizontally-Structured Models

An example of horizontally structured modeling is depicted in FIG. 1. FIG. 1 shows the progressive building up of a model 100 through processes depicted at A through J. The actual shape of the model 100 depicted in the figures is purely for illustrative purposes only, and is to be understood as not limiting, in any manner. In the figure, at A, the creation of the first feature of the model 100, known as the base feature 0 is depicted.

Referring again to FIG. 1, B depicts the creation of another feature, a datum plane that will be referred to as the base-level datum plane 1. This is a reference feature as described above and acts as a first coordinate reference. The arrows that flow from the creation of one feature to another indicate an associative relationship or link 13, here a parent/child relationship between the originating feature created and the feature(s) to which the arrow points. Hence, the base feature 0 is the parent of the base-level datum plane. As explained above, any change to the parent will affect the child (e.g., rotate the parent 90 degrees and the child rotates with it), and deletion of the parent results in deletion of the child. This effect ripples all the way down the family line. Since the base feature 0 is the great-ancestor of all later features in the modeling process, any change to the base feature will show up in every feature later created in the process and deletion of the base feature will delete everything. Note that since the base-level datum plane 1 is the child of the base feature 0, any change to the base-level datum plane will have no effect upon the base feature, but will affect all its progeny. As a reference coordinate, the base-level datum plane is useful as a positional tool.

It is preferred that the positioning of the base-level datum plane 1 with respect to the base feature 0 be chosen so as to make the most use of the base-level datum plane as a positional tool. Note that in FIG. 1, the base-level datum plane 1 is chosen to coincide with the center of the cylindrical base feature. By rotating the base-level datum plane symmetrically with the center of the base feature, all progeny will rotate symmetrically about the base feature as well. Differently shaped base features may suggest differently positioned base-level datum planes. Once again, it is noted that datum planes are used here because that is the coordinate system utilized by Unigraphics® software and is therefore illustrative only. Other software or systems may use coordinate reference features that are linear or three-dimensional. It is noteworthy then to appreciate that the teachings disclosed herein are not limited to planar reference features alone and may include various other reference features.

A second coordinate reference may be created as a child of the first coordinate reference described above, though this is not strictly necessary.

As seen at C of FIG. 1, three datum planes 2, 3, and 4 are created. Each datum plane is oriented orthogonal to the others so that the entire unit comprises a three-dimensional coordinate system 6. The 3-D coordinate system 6 thus created is a relative one, meaning it rotates and moves along with the model 100. This is in contrast to an absolute coordinate system that exists apart from the model 100 and as is common to all CAD/CAM/CAE software. Unigraphics® software for example, actually includes two absolute coordinate systems, a "world" coordinate system and a local "working level" coordinate system.

Figure 2:
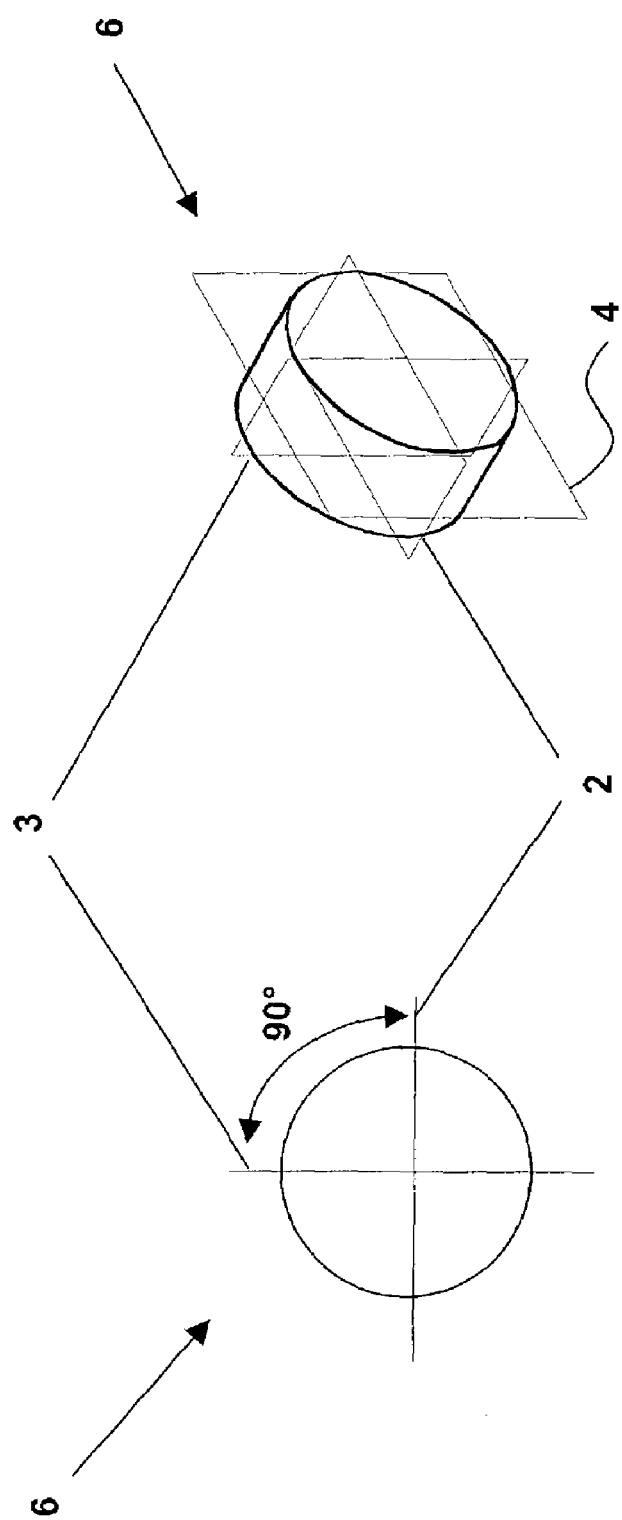
FIG. 2 is a magnified view of the relative 3-D coordinate system used in FIG. 1.

Referring to FIGS. 1 and 2, there are numerous ways and configurations possible to establish the 3-D coordinate system 6. For example, three independent datum planes, each referenced to another reference, or three datum planes relative to one another, where a first datum plane 2 may be referenced to a particular reference. A preferred method is to create a first datum plane 2 that is the child of the base-level datum plane 1 and offset 90 degrees therefrom. Then, a second datum plane 3 is created as a child of the first datum plane 2 and is offset 90 degrees therefrom. Note that the second datum plane 3 now coincides with the base-level datum plane 1, but they are not the same plane. It can be seen that any movement of the base-level datum plane I will result in corresponding movement of first 2 and second 3 datum planes of the 3-D coordinate system 6. The third datum plane 4 of the 3-D coordinate system 6 is created orthogonal to both the first and second planes, but is a child of the base feature 0 and will preferably coincide with a surface of the base feature. This is preferred with software that requires that physical features be mounted, or "placed", on a surface though they may be positioned relative to any number of datum planes. While not required, or explicitly enumerated, the third datum plane 4 may further include associative relationships with the first datum plane 2 and second datum plane 3, or any other reference plane. The third datum plane of the 3-D coordinate system is therefore referred to as the "face plane," while the first two datum planes of the 3-D coordinate system are referred to as the "positional planes". All physical features added to the model 100 from hereon will be "placed" onto the face plane and positioned relative to the positional planes datum planes 2 and 3 respectively of the 3-D coordinate system. It will be understood that the above-mentioned example of feature placement is illustrative only, and should not be construed as limiting. Any datum plane may operate as a "face plane" for feature placement purposes. Moreover, any feature may also be oriented relative to a reference axis, which may be relative to any reference, which may include, but not be limited to, a datum plane, reference plane, reference system, and the like, as well as combinations of the foregoing.

It is an advantage to using datum planes that features may be placed upon them just as they may be placed upon any physical feature, making the 3-D coordinate systems created from them much more convenient than simple coordinate systems found on other CAD/CAM/CAE software. It should be noted, however, that these techniques apply to software that utilize datum planes such as Unigraphics® V-series. For other software, there may, and likely will be, other techniques to establishing a 3-D coordinate system relative to the model 100 to which the physical features of the model 100 may be positioned and oriented. Once, again, this method is not to be construed as limited to the use of datum planes or to the use of Unigraphics® software.

Continuing once again with FIGS. 1 and 2, the system now includes the datum planes 2, 3, and 4, which may be manipulated by the single base-level datum plane 1 so as to affect the positioning of all features added to the base feature 0, but with the constraint that the "placement" of each feature is fixed relative to a face of the base feature 0. This is but one of many possible arrangements but is preferred in the Unigraphics® environment for its flexibility. Movement of the base-level datum plane 1 results in movement of the first two positional 2, 3 planes, but need not necessarily affect the datum plane 4. The result is that objects will move when the base-level datum plane 1 is moved, but be constrained to remain placed in the face plane. It is found that this characteristic allows for more convenient and detailed adjustment, though it is a preferred, rather than a mandatory characteristic of the invention.

Referring again to FIG. 1, we see the successive addition of physical features, or form features 5a through 5g, to the model 100 at D through J. At D, a circular boss 5a is mounted to the face plane and positioned relative to the positional planes. At each of E and F, a pad 5b, 5c is added to the model 100, thereby creating protrusions on either side. At G through J, individual bosses 5d, 5e, 5f, and 5g are added to the periphery of the model 100. Note that in each instance, the new feature is mounted to the face plane and positioned relative to the positional datum planes 2, and 3. This means that each feature 5 is the child of the face datum plane 4 and of each of the positional datum planes 2, and 3. In the embodiment shown, each feature is therefore a grandchild, great-grandchild, and great-great-grandchild of the base feature 0 by virtue of being a child of the face datum plane. 4, first datum plane 2 and second datum plane 3, respectively. This means that movement or changes of the base feature results in movement and changes in all aspects of the added features, including both placement and positioning.

Each feature added to the coordinate system of the model 100 is independent of the others. That is to say, in the example depicted in FIG. 1 that no physical feature (except the base feature) is the parent of another. Since no physical feature is a parent, it follows that each individual physical feature may be added, edited, suppressed, or even deleted at leisure without disturbing the rest of the model 100. This characteristic of the disclosed embodiment that permits model 100 development to proceed approximately at an order of magnitude faster than traditional "vertical" CAD/CAM/CAE development. It should be further noted that while the example provided identifies features exhibiting no respective associative relationships, such a characteristic is not necessary. Features may exhibit associative relationships with other features as well as other elements of the model 100. The constraint this adds is the loss of independence (and hence modeling simplicity) among the several features.

Figure 3:
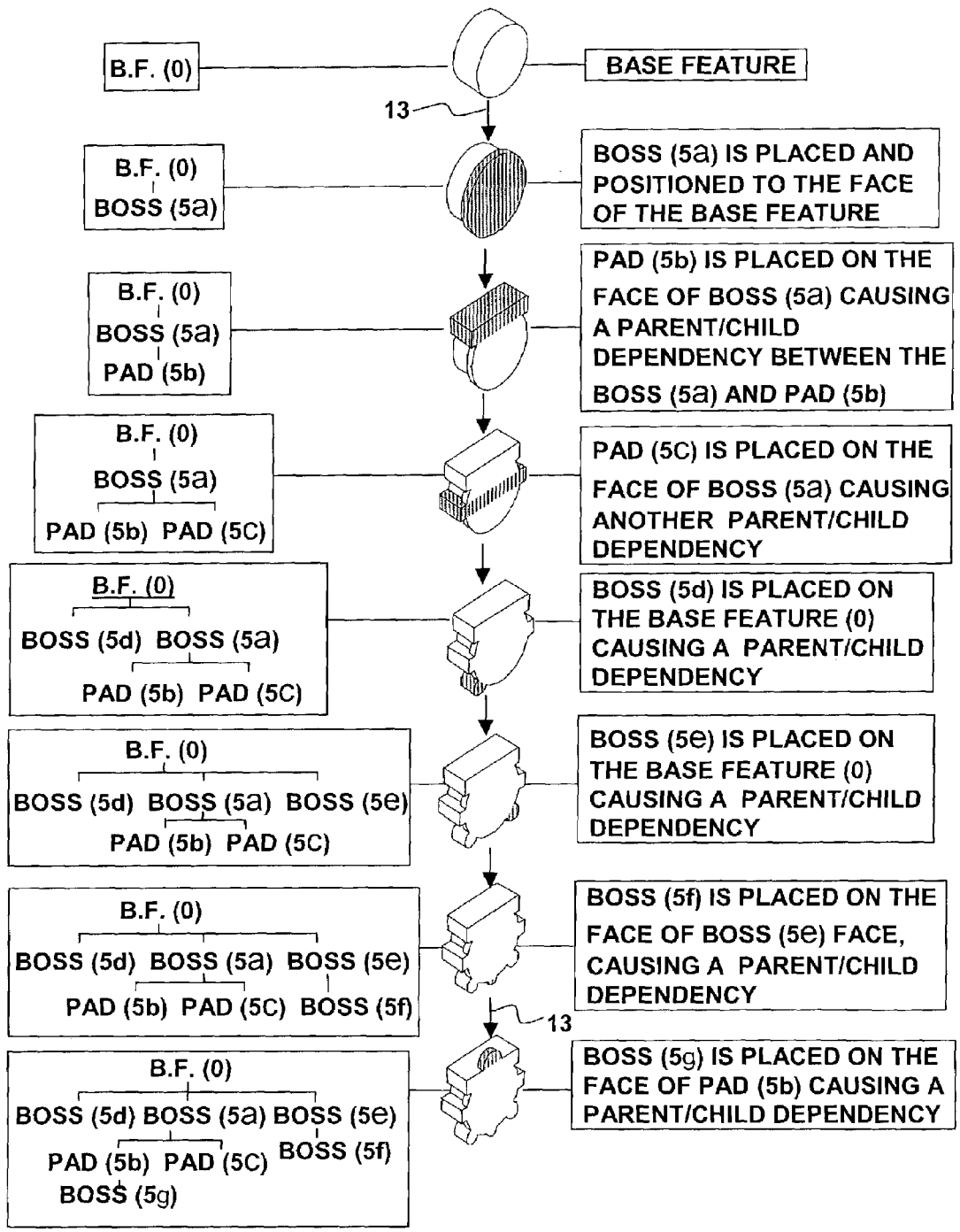
FIG. 3 is an example of the vertical modeling method.

The "vertical" methods of the prior art are graphically depicted in FIG. 3 and as taught by the Unigraphics® User's Manual. The column on the right of FIG. 3 describes the process performed, the central column shows the change to the model 100 as the result, and the leftmost column shows the changing tree structure. Note that here, since there are no datum planes utilized, there are only seven features shown as opposed to the eleven depicted in FIG. 1. It is noteworthy to observe the complex tree structure generated when features are attached to one another as depicted in FIG. 3, rather than to a central coordinate system as depicted by FIG. 1. Now, further consider what happens if the designer decides that the feature designated "Boss (5a)" (corresponding to 5a in FIG. 1) is no longer needed and decides to delete it. According to the tree structure in the lower left of FIG. 3, deletion of "Boss (5a)" results in the deletion of "Pad (5b)", "Pad (5c)" and "Boss (5g)". These features must now be added all over again. It is this duplication of effort that makes traditional "vertical" CAD/CAM/CAE design generally frustrating and time-consuming. Employment of the methods disclosed herein utilizing a similar model 100, suggest reductions of a factor of two in the time required for creation of a model 100, and time reductions of a factor of ten for making changes to a model 100.

It should be noted that certain form features may be preferably dependent from other form features or model 100 elements rather than directly dependent as children from the 3-D coordinate system as described herein. For example, an edge blend may preferably be mounted on another physical feature, not a datum plane. Such features will preferably be added to a single physical feature that itself is a child of the 3-D coordinate system, the intent being to keep the lineage as short as possible to avoid the rippling effect of a change whenever a feature is altered or deleted.

It is also noted that additional datum planes may be added as features to the 3-D coordinate system as children just like any physical feature. These would be added as needed to position other physical features, or to place them on surfaces in addition to the datum plane 4. Any additional face planes needed to mount features should be at the same level as the 3-D coordinate system, that is to say a sibling of the original datum plane 4, not a child of it. In the example shown, such an added plane would be created as a child of the base feature 0 just as the third datum plane 4 is.

Enhancement To Horizontally Structured Modeling

Figure 4:
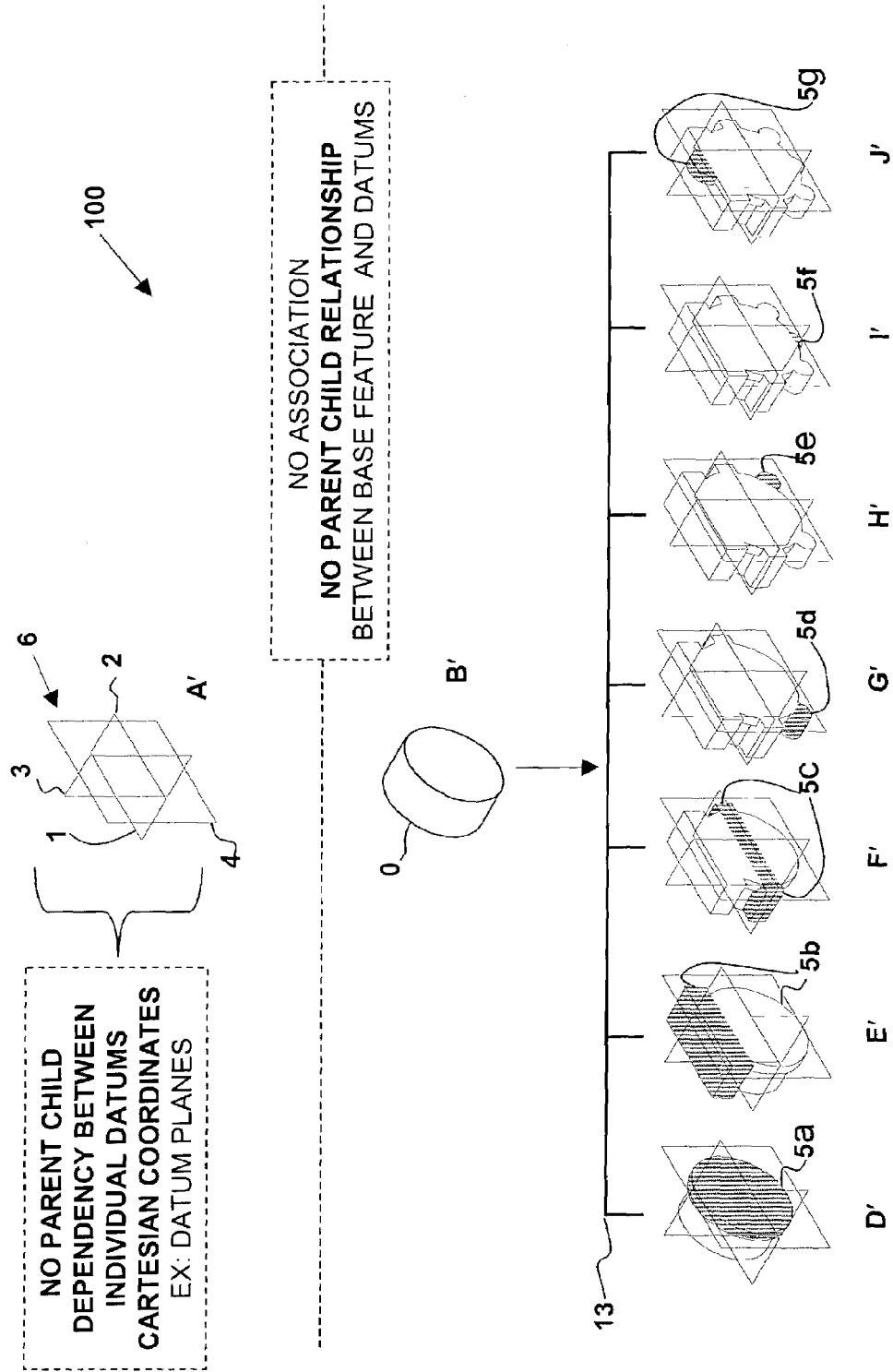
FIG. 4 is a diagram depicting an embodiment of the horizontal modeling method.

A first embodiment of the method is depicted and exemplified in FIG. 4. FIG. 4 also depicts the progressive building up of a model via process depicted at A' through J'. The actual shape of the model 100 depicted in the figures is once again, purely for illustrative purposes, and is to be understood as not limiting, in any manner. In this embodiment, a set of coordinate references is established. As seen at A' of FIG. 4, three datum planes are created. Similar to the above-mentioned horizontally structured modeling disclosure, each datum plane may be oriented orthogonal to the others so that the entire unit comprises a three-dimensional coordinate system 6. Alternatively, each datum plane or 3-D coordinate system may be positioned and oriented relative to some other reference, for example an absolute reference or coordinate system. For example, the 3-D coordinate system 6 may be relative to another reference, or an absolute reference such as the reference supplied by the Unigraphics® environment. This means it may rotate and move along with a reference.

A preferred method when utilizing Unigraphics® software is to create a first datum plane 2. Then, a second datum plane 3 is created independent of the first datum plane 2 and may, but need not be, offset 90 degrees therefrom. The third datum plane 4 is created, and once again, may be orthogonal to both the first datum plane 2 and second datum plane 3, but not necessarily so, thereby formulating the orthogonal 3-D coordinate system 6.

One advantage to using datum planes is that features may be placed upon them just as they may be placed upon any physical feature, making the 3-D coordinate systems created from them much more convenient than simple coordinate systems found on other CAD/CAM/CAE software. It should be noted, however, that these techniques apply to software that utilize datum planes such as Unigraphics®. For other software, there may and likely will be other techniques to establishing a 3-D coordinate system relative to the model 100 to which the physical features of the model 100 may be positioned and oriented. Once, again, this method is not to be construed as limited to the use of datum planes or to the use of Unigraphics® software.

Another feature of this embodiment is that the relation between reference datum planes e.g., 2, 3, and 4 may, but need not be, associative. Unlike earlier mentioned horizontally structured modeling methods where a parent-child relationship was utilized, in this instance the relationship between the datum planes may be as simple as position and orientation. Once again, the teachings of this invention are not limited to planar reference features.

Turning now to B' depicted in FIG. 4, a base feature 0 is added as a first feature, assembly or a sketch to an existing coordinate system or associative datum plane structure comprising datum planes 2, 3, and 4. Where in this instance, unlike the horizontally structured modeling methods described above, there may only be a positional and orientational relationship but not necessarily an associative or parent child relationship among the datum planes 2, 3, and 4. The elimination of an associative relationship among the datum planes 2, 3, and 4, the 3-D coordinate system 6, and the base feature 0 provides significant latitude in the flexibility attributed to the 3-D coordinate system 6 and the base feature 0. Therefore, the datum plane structure comprising 2, 3, and 4 may take its place as the zero'th level feature of the model 100. Thereafter, the base feature 0 is added at B' and the physical features, or form features 5*a*–5*g* are added at D' through J' in a manner similar to that described earlier. However, once again, it is noteworthy to appreciate that here a parent child relationship is eliminated between the base feature 0 and the physical features, or form features 5*a*–5*g*. In addition, an associative relationship, in this case a parent child relationship is created between the physical features, or form features 5*a*–5*g* and the datum planes 2, 3, and 4.

It may be beneficial to ensure that the positioning of the base feature 0 with respect to the datum planes 2, 3, and 4 be chosen so as to make the most use of the base feature 0 as an interchangeable element. Note once again from FIG. 1, in that embodiment, the base-level datum plane was chosen to coincide with the center of the cylindrical base feature. By rotating the base-level datum plane symmetrically with the center of the base feature, all progeny will rotate symmetrically about the base feature as well. Differently shaped base features will suggest differently positioned base-level datum planes. In this embodiment, the physical features, or form features 5*a*–5*g* and the datum planes 2, 3, and 4 maintain an associative relationship, but neither with the base feature 0. When the 3-D coordinate system is established before the fundamental shape is placed on the screen and presented to the user, it simplifies substitution of the base feature 0 to other models. For example, where it may be desirable to change one base feature 0 for another, and yet preserve the later added physical features, or form features e.g., 5*a*–5*g*. The disclosed embodiment simplifies this process by eliminating the parent child relationship between the base feature 0 and the datum planes. Therefore, the base feature 0 may be removed and substituted with ease. Moreover, the physical features, or form features 5*a*–5*g* and the datum planes 2, 3, and 4 may easily be adapted to other base features of other models.

Figure 5:
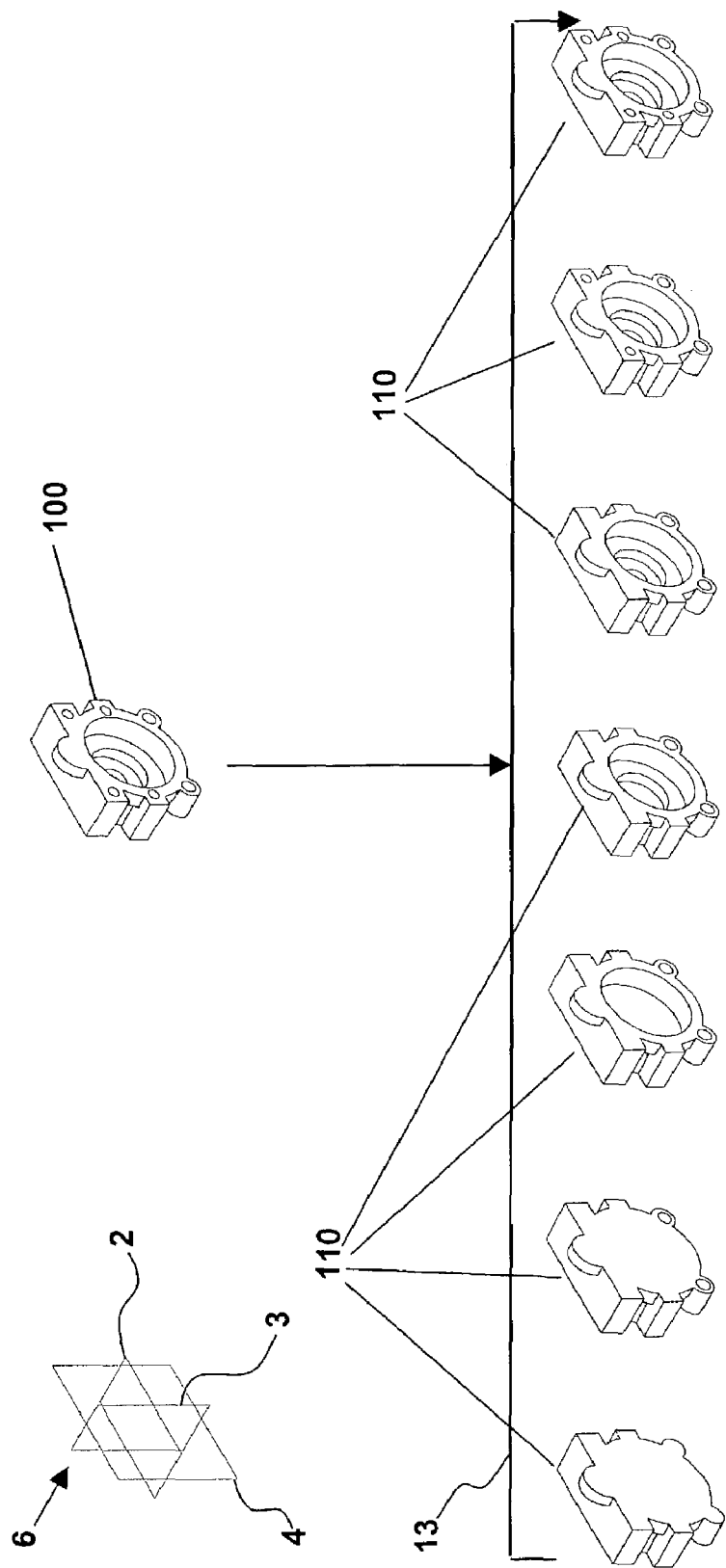
FIG. 5 depicts an exemplary formation of a horizontally structured model and an analysis model therefrom.

Referring now to FIG. 5, another feature for generating a solid model 100 may be achieved with extracted models, called virtual extract(s) or extracted bodies, hereinafter denoted extract(s) 22. Each extract 22 represents the model 100 at a particular part or step of the modeling process and each is a child of the model 100 from which it is extracted (often a master process model as will be discussed in detail later). Any changes to the parent model 100 are automatically reflected in all the relevant extract(s) 22, but changes to the extract(s) 22 have no effect on the parent model 100. Each extract 22 is a three-dimensional snapshot of the model 100 at a moment in "time" of its creation. The extracts 22 created for each operation are children of the parent model 100. By changing the parent model 100, the extracts 22, and therefore, the modeling process is automatically updated.

The "extraction" is accomplished through a software module provided with the CAD/CAM/CAE software, otherwise the user may create a software program for the process. In Unigraphics® software, a Modeling Module includes software configured to handle the extraction process. The order of creation of the extracts 22 is preferably dictated by a user-friendly graphical interface, referred to as a model navigation tool. The model navigation tool preferably allows the user to arrange the order of features through simple mouse operations to make manipulation of the model 100 as simple and intuitive as practicable. Since the model 100 is preferably created using the horizontally structured methods described above, editing the model 100 is a simple and expedited matter of adding, editing, suppressing, or deleting individual features 5 of the model 100, which will automatically update all the extract(s) 22.

One may think of an extract 22 as a three-dimensional "snapshot" of the assembly of the model 100 in progress, showing all of the feature(s) 5 up to that point in the development of the model 100, but none that come after it. It is noteworthy to appreciate that feature(s) 5 may thereafter be added to the extract 22 without appearing in the model 100, however any feature(s) 5 added to the model 100 will appear in the extract 22 if the particular feature is directed to be added at or before the state of the model 100 represented by the extract 22.

Enhancement to Horizontally Structured Modeling Employing Model Link/Unlink

Another feature of the horizontally structured modeling and modeling is disclosed which utilizes the horizontal CAD/CAM/CAE modeling methods described above. Specifically, the first embodiment is further enhanced to ultimately facilitate generating horizontally structured CAD/CAM/CAE models. In an exemplary embodiment, horizontally structured modeling methods disclosed above are employed to facilitate the generation of one or more models for creating the actual part To facilitate the method disclosed and model creation, a link and unlink functionality is disclosed which provides for automatic references and the modification of associative relationships among one or more CAD/CAM/CAE models and model elements. The link/unlink function allows a newly created or existing model or model elements to be replaced by another. Moreover, the features associated with a first model may be re-associated to another model with little if any impact to the associated features.

In the Unigraphics® environment, the exemplary embodiment takes advantage of the existing link and unlink functionality of the Unigraphics® CAD/CAM/CAE system software coupled with the methods of horizontally structured CAD/CAM/CAE modeling to facilitate an enhanced method of modeling. In the exemplary embodiment, an illustration employing Unigraphics® software and references is provided. However, it should be noted that while the exemplary embodiment is described by way of illustration with and reference to Unigraphics® CAD/CAM/CAE system software it is not to be construed as limited thereto. The disclosed embodiments are equally applicable to any CAD/CAM/CAE system software, which exhibits or possesses the dictated requirements and capabilities. The disclosed method includes the removal of feature dependency between modeling elements, in this instance a form feature of model generated as disclosed earlier, and a linked geometry.

Therefore, enabling the form feature or linked geometry to be replaced by a new for feature or linked geometry without losing the prior positional and orientational dependencies associated with the form feature or linked geometry. Therefore, this capability maintains the associative relationships generated between a linked geometry and a model element.

Referring to FIGS. 1 and 5, for a better understanding of the features of the disclosed embodiment, reference is made to the earlier disclosed enhanced modeling embodiment, as well as exemplified below. Therefore, the disclosure will be in reference to horizontally structured product modeling but is not to be construed as limited thereto. In reference to the modeling, once again, a suitable base feature 0 may be selected for developing a 3-D parametric solid model 100 with the horizontally structured modeling method.

FIG. 1 once again, shows the progressive building up of a model 100 via process depicted at A' through J'. The actual shape of the model 100 depicted in the figures is once again, purely for illustrative purposes, and is to be understood as not limiting, in any manner. Once again, in this embodiment, a set of coordinate references is established. These coordinate references including datum planes and axes exhibit the same characteristics, properties and relationships as described in the above mentioned embodiments and therefore will not be repeated here. Moreover, the relationships among the modeling elements are similar and need not be reiterated to illustrate the application of the exemplary embodiment.

Turning now to FIG. 4 and once again to the build up of the model 100 in an exemplary embodiment, at B', a base feature 0 is added as a first feature, assembly or a sketch to an existing coordinate system or associative datum plane structure comprising the first, second, and third datum planes 2, 3, and 4 respectively. Where in this instance, there is only a positional and orientational relationship but not necessarily an associative or parent child relationship among the first, second, and third datum planes 2, 3, and 4 respectively. The elimination of an associative relationship among the first, second, and third datum planes 2, 3, and 4 respectively, the 3-D coordinate system 6, and the base feature 0 provides significant latitude in the flexibility attributed to the 3-D coordinate system 6 and the base feature 0. Therefore, the datum plane structure comprising the first, second, and third datum planes 2, 3, and 4 respectively, may take its place as the zero'th level feature of the model 100. Thereafter, the base feature 0 is added at B' and the physical features, or form features 5a–5g are added at D' through J' in a manner similar to that described earlier. However, once again, it is noteworthy to appreciate that here a parent child relationship is eliminated between the base feature 0 and the physical features, or form features 5a–5g. In addition, an associative relationship, in this case a parent child relationship is created between the physical features, or form features 5a–5g and the first, second, and third datum planes 2, 3, and 4 respectively.

In an illustration of the exemplary embodiment the model 100 including the base feature 0, the first, second, and third datum planes 2, 3, and 4 respectively of the coordinate system 6, as well as the form features 5a–5g may be manipulated utilizing the link/unlink function to develop a model 100 or modify and existing model 100. In an example which exemplifies the features of the horizontally structured modeling would be to unlink one or more of the first, second, and third datum planes 2, 3, or 4 respectively with respect to the form features 5a–5g, thereby eliminating the associative relationships, thereafter, substituting a new or different datum planes and re-linking the form features 5a–5g to establish the associative relationships with the new datum planes. Such a capability makes extraordinary use of the datum planes or form features as interchangeable model elements. Note also, the converse is also possible where additional form features may be interchangeably utilized with a particular datum planes e.g., 2, 3, and 4.

In yet another illustration of the exemplary embodiment, a model element such a form feature 5b for instance may be linked to another form feature or a form feature of another model in such a manner that when a change is implemented which modifies the first form feature in this instance 5b, the second is automatically modified.

In this embodiment, once again, the physical features, or form features 5a–5g and the first, second, and third datum planes 2, 3, and 4 respectively, maintain an associative relationship, but neither with the base feature 0. When the 3-D coordinate system is established before the fundamental shape is placed on the screen and presented to the user, it simplifies substitution of the base feature 0 to other models. For example, where it may be desirable to change one base feature 0 for another, and yet preserve the later added physical features, or form features e.g., 5a–5g. The disclosed embodiment simplifies this process by eliminating the parent child relationship between the base feature 0 and the datum planes. Therefore, the base feature 0 may be removed and substituted with ease. Moreover, the physical features, or form features 5a–5g and the first, second, and third datum planes 2, 3, and 4 respectively, may easily be adapted to other base features of other models.

The described independence of the modeling and model element described above provides significant flexibility in the modeling process by allowing a user to interchangeably apply various features to a particular model 100. Likewise, interchangeable models may be generated without impacting the particular features or datum planes (e.g., 2, 3, and 4) utilized. For example, different base features 0 may be selected and a new model generated therefrom and subsequently, the same features and associated datums added. Moreover, links may be established between model elements to establish associative relationships such that when a change is made to a first model element, the change is automatically reflected in the linked element. Referring once again to FIGS. 1 and 4, the modeling process of the exemplary embodiment where form features are added to the base feature 0 is depicted. The process is similar to that disclosed above and therefore, need not be repeated.

Once again, one may recognize the model 100 as the completed horizontally structured model 100 depicted at J' in FIG. 4 including all of the form features 5a–5g. Once again, some CAD/CAM/CAE software packages may require that the addition of the form feature(s) 5a–5g to be in a particular order. Once again, in such a case, a method for reordering the features may prove beneficial.

It is noteworthy to appreciate that the link/unlink capability realizes its potential and significance primarily due to the characteristics of the horizontally structured model 100 and disclosed herein. Specifically, the separation/distribution of associative relationships in the models provides the enhanced flexibility and ease of model generation and modification achieved.

In contrast, in "vertical" modeling as depicted in FIG. 3, where the traditional approach to modeling was to create separate features in series. If a change or deletion was made in one model, it was necessary to individually update the entire model with all the subsequent features. Using the horizontally structured modeling disclosed herein and employing the modeling link/unlink capabilities, it is now possible to generate multiple horizontally structured models linked in a manner such that changes in one model are automatically carried out in other linked models.

Figure 6:
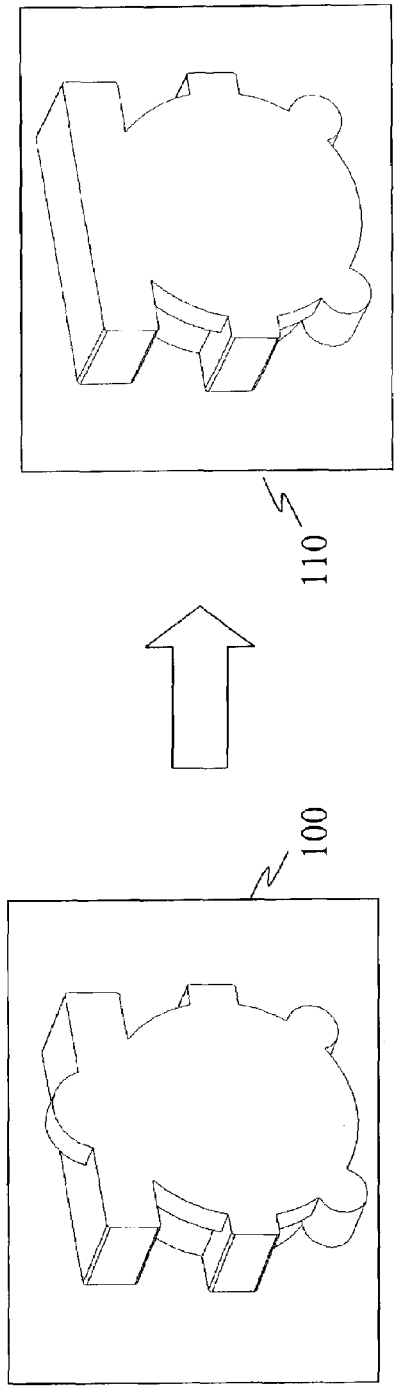
FIG. 6 depicts an illustration of an exemplary embodiment.
Figure 6:
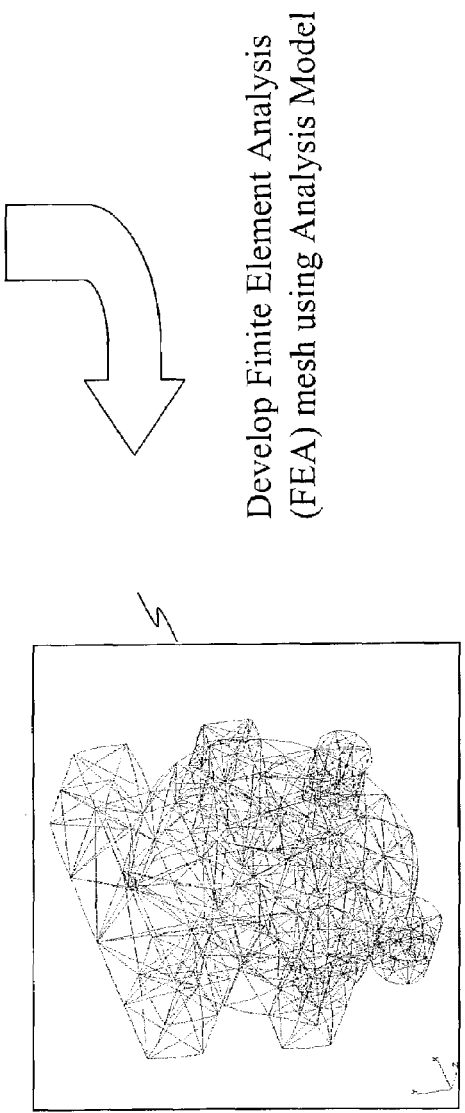

Turning now to FIGS. 5 and 6 as well, in an exemplary embodiment, a "horizontal tree structure" is employed to add feature(s) 5 to a model 100. Preferably, each feature 5 added includes the establishment of a parent/child relationship link 13 between coordinate system and the respective feature(s) 5. Thereby, individual feature(s) 5 may readily be added, edited, suppressed, or deleted, and the like, without affecting the rest of the model 100.

With a 3-D solid model completed, (or anywhere along the process of developing the model 100) one or more analysis models 110 may be created. In an exemplary embodiment, an analysis model 110 may be created by an extraction similar to the in-process models above. Other methods such as a copy with a link could be employed. It will be appreciated that any method or process, which provides for a linked copy of the model is sufficient.

In an exemplary embodiment, an analysis model 110 would only include the feature(s) 5 relevant to a particular analysis. For example, feature(s) 5 not required for analysis (e.g., pads, fillets, and the like) may be eliminated or re-ordered after extraction/copy to create the analysis model 110. Elimination of unnecessary feature(s) 5 simplifies the characteristics of the analysis model 110 and facilitates the analysis or accelerates the processing associated therewith.

Continuing with FIG. 6, the analysis model 110 provides a 3-D model with the particular feature(s) and characteristics that are subject of the analysis to be performed. In an exemplary embodiment, the analysis model 110 may now be readily be employed for analysis whether native (e.g., internal) to the CAD modeling system or exported to an external analysis tool. For example, the analysis model 110 may be exported to a separate file for use with Finite Element Analysis (FEA) (e.g., structural analysis, vibration analysis, and the like), dynamic analysis (rigid body motion), as well as other applications where the analysis model 110 may be employed as a representation of an actual component. The analysis model 110 once exported could still include links to the model 100 or be unlinked for example in a standard file format such as .STL and the like). In an exemplary embodiment, the analysis model would preferably be linked to take greatest advantage of the features and benefits of horizontally structured modeling.

It will be appreciated that an important advantage to the disclosed process is that it facilitates utilizing a single model for product design and analysis. Current technologies often result in multiple models being generated for various analyses, product design and manufacturing operations. Moreover, it will be appreciated that the same model 100 and analysis model 110 may now be directed toward manufacturing processes. Application of horizontally structured manufacturing processes is disclosed in HORIZONTALLY STRUCTURED CAD/CAM COORDINATE SYSTEM referenced above.

Another advantage of the disclosed process for development of an analysis model 110 is that when linked (e.g., where the analysis model is an extract or copy with a link) with a model, changes incorporated in the model are readily incorporated into the analysis model 110. This dramatically simplifies the standard methodology of design where changes must be manually entered at each part of the process, resulting in multiple amendments to multiple models (e.g., product, analysis, structural analysis, dynamic analysis, and the like) for any single change.

Lastly, as stated earlier it will be appreciated that performing analysis with the analysis model 110 as opposed to the model or another generated model is that it reduces processing time. The analysis model 110 may be simplified and configured to not include feature(s) 5 that are not relevant or important for analysis. Therefore, the analysis processing would not have to address the details that would otherwise be presented.

It should be noted the disclosed embodiments may be implemented on any CAD/CAM/CAE software system that supports the following functions and capabilities: reference planes, datum planes or similar Cartesian equivalents; parametric modeling, or similar equivalent; and feature modeling or similar equivalents.

It should be noted that the term modeling elements or elements of model and similar phraseology have been used throughout this specification. Such terminology is intended to include, but not be limited to: a reference, a reference axis, a reference datum, a datum, a coordinate system, a reference set, a geometry, a linked geometry, a linked body, a virtual blank, a base feature, a product model, a master process model, a master product and process concurrent model, an extract, an in-process model, an extracted body, a form feature, a manufacturing feature, a process sheet, a drawing, a product drawing, a tool drawing, a fixture, a spreadsheet and the like as well as combinations of the foregoing.

It must be noted that the term "machining" has been used throughout this specification, but the teachings of the invention are applicable to any manufacturing process upon a blank, including welding, soldering, brazing & joining, deformations (e.g., crimping operations), stampings e.g., hole punchings and the like including combinations of the foregoing.

The disclosed method may be embodied in the form of computer-implemented processes and apparatuses for practicing those processes. The method can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus capable of executing the method. The present method can also be embodied in the form of computer program code, for example, whether stored in a storage medium, loaded into and/or executed by a computer, or as data signal transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus capable of executing the method. When implemented on a general-purpose microprocessor, the computer program code segments configure the microprocessor to create specific logic circuits.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of horizontally structured CAD/CAM/CAE modeling for analysis comprising:
    establishing a horizontally structured model of an object in a CAD/CAM/CAE modeling system;
    creating an analysis model from said horizontally structured model; and
    performing analysis employing said analysis model.

2. The method of claim 1 wherein said analysis model exhibits an associative relationship with said horizontally structured model.

3. The method of claim 2 wherein said associative relationship is a parent/child relationship.

4. The method of claim 1 wherein said creating an analysis model comprises making an extract of said horizontally structured model.

5. The method of claim 1 wherein said creating an analysis model comprises making a copy with link from said horizontally structured model.

6. The method of claim 5 wherein said link comprises an associative relationship with said horizontally structured model.

7. The method of claim 1 wherein said analysis model includes features only relevant to said analysis.

8. The method of claim 1 wherein said performing comprises conducting analysis native to said CAD/CAM/CAE modeling system.

9. The method of claim 1 further including exporting said analysis model to an external analysis tool and said performing is conducted with said external analysis tool.

10. The method of claim 9 wherein said external analysis tool provides finite element analysis.

11. A horizontally structured analysis model formulated with a CAD/CAM/CAE modeling system comprising:
    a horizontally structured model of an object;
    an analysis model created from said horizontally structured model, wherein said analysis model is employed for performing analysis.

12. The analysis model of claim 11 wherein said analysis model exhibits an associative relationship with said horizontally structured model.

13. The analysis model of claim 12 wherein said associative relationship is a parent/child relationship.

14. The analysis model of claim 11 wherein said analysis model comprises an extract of said horizontally structured model.

15. The analysis model of claim 11 wherein said analysis model is formulated as a copy with link from said horizontally structured model.

16. The analysis model of claim 15 wherein said link comprises an associative relationship with said horizontally structured model.

17. The analysis model of claim 11 wherein said analysis model includes features only relevant to said analysis.

18. The analysis model of claim 11 wherein said performing comprises conducting analysis native to said CAD/CAM/CAE modeling system.

19. The analysis model of claim 11 further including an exported analysis model for an external analysis tool end said performing is conducted with said external analysis tool.

20. The analysis model of claim 19 wherein said external analysis tool provides finite element analysis.

21. A storage medium encoded with a machine-readable computer program code, said storage medium including instructions for causing a computer to implement a method for horizontally structured CAD/CAM/CAE modeling for analysis comprising:
    establishing a horizontally structured model of an object in a CAD/CAM/CAE modeling system;
    creating an analysis model from said horizontally structured model; and
    performing analysis employing said analysis model.

22. A computer data signal embodied in a computer readable format, said computer data signal comprising code configured to cause a computer to implement a method for horizontally structured CAD/CAM/CAE modeling for analysis comprising:
    establishing a horizontally structured model of an object in a CAD/CAM/CAE modeling system;
    creating an analysis model from said horizontally structured model; and
    performing analysis employing said analysis model.

* * * * *